(12) United States Patent
Hamada et al.

(10) Patent No.: US 7,923,522 B2
(45) Date of Patent: Apr. 12, 2011

(54) PROCESS FOR PREPARING A DISPERSION LIQUID OF ZEOLITE FINE PARTICLES

(75) Inventors: Yoshitaka Hamada, Joetsu (JP); Masaru Sasago, Osaka (JP); Hideo Nakagawa, Shiga (JP); Yasunori Morinaga, Osaka (JP)

(73) Assignees: Shin-Etsu Chemical Co., Ltd., Tokyo (JP); Panasonic Corporation, Osaka (JP)

( * ) Notice: Subject to any disclaimer, the term of this patent is extended or adjusted under 35 U.S.C. 154(b) by 483 days.

(21) Appl. No.: 12/060,291

(22) Filed: Apr. 1, 2008

(65) Prior Publication Data
US 2008/0248280 A1 Oct. 9, 2008

(30) Foreign Application Priority Data
Apr. 3, 2007 (JP) ................. 2007-097494

(51) Int. Cl.
*C08G 77/08* (2006.01)
(52) U.S. Cl. .......................... 528/21; 528/39
(58) Field of Classification Search ............ 528/21, 528/39
See application file for complete search history.

(56) References Cited

U.S. PATENT DOCUMENTS

| 6,261,357 B1 | 7/2001 | Egami et al. |
| 2001/0020416 A1 | 9/2001 | Yoshikawa et al. |
| 2004/0105986 A1 | 6/2004 | Ogihara et al. |
| 2005/0165197 A1 | 7/2005 | Ogihara et al. |

FOREIGN PATENT DOCUMENTS

JP 2004-079592 A 3/2004

OTHER PUBLICATIONS

Wang et al., "Pure-Silica Zeolite Low-*k* Dielectric Thin Films", *Adv. Mater.*, 2001, pp. 746-749, vol. 13, No. 10.

*Primary Examiner* — Kuo-Liang Peng
(74) *Attorney, Agent, or Firm* — Alston & Bird LLP

(57) ABSTRACT

The invention provides a preparation process of organic-group-modified zeolite fine particles excellent in stability of particle size and to be used for electronic materials or the like. The preparation process comprises a first step of obtaining a liquid containing zeolite seed crystals having a particle size of 80 nm or less which are formed in the presence of a structure directing agent, a second step of adding an organic-group-containing hydrolyzable silane compound to the liquid obtained by the first step, and a third step of maturing the liquid of the second step at temperature higher than that of the first step. A dispersion liquid of zeolite fine particles obtained by the process.

11 Claims, 4 Drawing Sheets

PROCESS FOR PREPARING A DISPERSION LIQUID OF ZEOLITE FINE PARTICLES

CROSS REFERENCE TO RELATED APPLICATIONS

This application claims the benefit of Japanese Patent Application No. 2007-097494, filed Apr. 3, 2007, which is incorporated herein by reference in its entirety and for all purposes.

FIELD OF THE INVENTION

The present invention relates to a preparation process of zeolite fine particles modified with an organic group, excellent in stability of a particle size and used for electronic materials and the like; zeolite fine particles modified with an organic group available by the preparation process; and a zeolite-containing film to be used for an dielectric film for semiconductor devices or the like by using it.

BACKGROUND OF THE INVENTION

Zeolite has pores in the crystal structure of silicon oxide so that many applications utilizing the crystal structure or pores have been reported. In particular, siliceous zeolite substantially free of a metal such as aluminum is expected to be used for electronic materials such as low-dielectric-constant dielectric films as follows.

In the fabrication of semiconductor integrated circuits, as their integration degree becomes higher, an increase in interconnect delay time due to an increase in interconnect capacitance, which is a parasitic capacitance between metal interconnects, prevents their performance enhancement. The interconnect delay time is so-called an RC delay which is in proportion to the product of electric resistance of metal interconnects and the static capacitance between interconnects. Reduction in the resistance of metal interconnects or reduction in the capacitance between interconnects is necessary for reducing this interconnect delay time.

The reduction in the resistance of an interconnect metal or the interconnect capacitance can prevent even a highly integrated semiconductor device from causing an interconnect delay, which enables miniaturization and high speed operation of it and moreover, minimization of the power consumption.

One of the possible methods for reducing an interconnect capacitance is to reduce a dielectric constant of an interlayer dielectric film formed between metal interconnects. A material having a dielectric constant of 2.5 or less is usually prepared by introducing pores inside of the material to make it porous. When an dielectric film is made porous, however, the film has reduced mechanical strength and reliability of it during fabrication of semiconductor devices cannot be ensured. Many investigations have therefore been made in order to improve the mechanical strength of such a porous film. An attempt to use zeolite having pores in the crystal structure of silicon oxide has attracted attentions because it has strength increased by crystallization and is substantially free of a silanol residue and is therefore hydrophobic. There are many reports on it (for example, Adv. Mater. 13, No. 10, 746(2001) or Japanese Patent Provisional Publication No. 2004-165402 by the present inventors).

In use of a thin film for semiconductor devices, what is important is that the film must be free of metal contamination and is homogeneous. In addition, zeolite used for it is required to have a uniform particle size to some extent. As zeolite crystals to be used therefor, those obtained by hydrothermal synthesis in the presence of a structure directing agent are usually employed. As a material to be used in a minute structure of semiconductor devices, the zeolite crystals available by hydrothermal synthesis are not always satisfactory in the particle size and uniformity of it. In particular, a material used in a semiconductor minute structure is required to have a small and uniform particle size because a thin film must be formed from it. It is very difficult to obtain zeolite fine particles having a particle size of 100 nm or less and at the same time, having a uniform particle size.

As an attempt to obtain such a material, Japanese Patent Provisional Publication No. 2004-79592 proposes a process of obtaining zeolite crystals by hydrothermal synthesis, centrifuging and separating them by particle size, removing zeolite crystals and aggregates which have become excessively large, and using only fine crystals having a small particle size.

SUMMARY OF THE INVENTION

In order to improve smoothness or uniformity of a film, it is necessary to prevent mixing of excessively large zeolite fine particles. Zeolite crystals grow in equilibrium of aggregation and crystallization of a silicon oxide unit using a structure directing agent as a nucleus and re-dissolution and their growth reaction proceeds slowly. When a conventional reaction is used for preparation of zeolite crystals having a uniform particle size, the crystals thus obtained have inevitably a particle size of 100 nm or greater, which is a particle size available in the balance of crystal growth and re-dissolution. It is therefore very difficult to prevent mixing of zeolite fine particles having a large particle size when synthesis of fine particles of 80 nm or less, especially about 10 nm is intended by the conventional process.

If zeolite fine particles growing in a reaction mixture of hydrothermal synthesis have a markedly small particle size, an active silanol amount on the surface of the particles is relatively high in the whole particles and they becomes unstable. These unstable fine particles tend to be stable by growing more and reducing the surface silanol amount. If they are not grown to be large zeolite crystals, on the other hand, peripheral portions of the crystals at which crystallization has proceeded insufficiently bond to and aggregate with each other to form a large mass during the treatment in subsequent steps. A considerable amount of particles having an unusually large particle size are therefore mixed in the dispersion liquid of zeolite fine particles having a minute particle size obtained by the conventional process. When zeolite fine particles are used for semiconductor materials or processing, it is the common practice to remove foreign matters having a large particle size by filtering them through a filter having a pore size of approximately 0.2 μm. It is however difficult to filter zeolite fine particles obtained by the conventional process, because a filter tends to be clogged with them.

In addition, zeolite fine particles having a minute particle size obtained by the conventional process have a problem in storage stability when it is in the form of a film-forming composition solution which tends to cause aggregation. As a method for preventing aggregation of particles in the film-forming composition, the present inventors announce a process of synthesizing zeolite, modifying the surface thereof with an organosilane compound and then terminating the reaction activity of the organosilane portion with an organic carboxylic acid (Japanese Patent Provisional Publication No. 2005-216895). This process however does not succeed in obtaining zeolite fine particles filterable through a filter having a pore size of 0.2 μm.

In view of the above-described problems, the invention has been investigated. An object of the invention is to provide a preparation process of organic-group-modified zeolite fine particles having a particle size which conventional zeolite fine particles have failed to have stably, containing almost no particles of an unusual particle size, being stabilized, and can be easily handled; and zeolite fine particles modified with an organic group. Another object of the invention is to provide a film-forming composition containing zeolite fine particles modified with an organic group which can be, when prepared as a solution of the composition, filtered through a filter having a pore size of 0.2 μm or less even without removing fine particles having an unusual particle size by physical separation means; and a zeolite-containing film using the composition and a preparation process thereof. A further object of the invention is to provide, as application of the zeolite fine particles modified with an organic group, a zeolite-containing film and a semiconductor device having a low-dielectric-constant dielectric film using it.

The term "zeolite crystals" usually means zeolite crystals having a crystal lattice with a long-range regularity and a particle size of from 10 to 15 nm or greater. In this specification, crystals having a portion with a zeolite-like atomic arrangement and providing a signal derived from zeolite in X-ray diffraction, and moreover. Clusters of approximately 1 nm in which silicon oxide units have been arranged with regularity with a structure directing agent as a nucleus are also called "zeolite crystals, or "zeolite seed crystals" in order to discriminate them from amorphous solids having no regularity. The term "particle size" means that of the zeolite crystals and even if they have a portion which has lost the regularity, the particle size embraces this portion.

The present inventors carried out an extensive investigation with a view to overcoming the above-described problems. As a result, a dispersion liquid of zeolite fine particles modified with an organic group and substantially free of particles grown to be excessively greater than the intended particle size was obtained by forming zeolite seed crystals during hydrothermal synthesis of zeolite in the presence of a structure directing agent (first step), adding a hydrolyzable silane compound containing an organic group having at least one carbon atom bonded to a silicon atom to the reaction mixture containing fine crystals which are growing but have not been grown to a particle size of 80 nm or greater (second step), and carrying out a maturing reaction under reaction conditions stronger than those of the first step (third step). In the conventional process, the dispersion liquid cannot be filtered without removing particles having an unusual particle size in advance by physical means. It has been found that with respect to the zeolite fine particles prepared by the above-described process, a film-forming composition containing the zeolite fine particles can be filtered through a filter having a pore size of 0.2 μm or less, leading to the completion of the invention.

There is thus provided a process for preparing a dispersion liquid of zeolite fine particles modified with an organic group, which comprises a first step of obtaining a liquid containing zeolite seed crystals having particle size of 80 nm or less which are formed in the presence of a structure directing agent, a second step of adding, to the liquid obtained by the first step, a hydrolyzable silane compound which has an organic group containing at least one carbon atom bonded to a silicon atom of the silane compound, and a third step of maturing the liquid of the second step at a temperature higher than that of the first step. In order to use for various purposes zeolite fine particles which have not yet reached a stable particle size of approximately 100 nm or greater, the surface of zeolite fine particles has conventionally been modified with a silicon unit substituted with a hydrocarbon. A maturing reaction stronger than that of the conventional one drastically changes the physical properties of the zeolite surface and suppresses aggregation activity of zeolite greatly. As a result, zeolite fine particles having a uniform particle size can be obtained.

One example to raise the temperature in the step of carrying out a maturing reaction is that the third step is performed at a pressure higher than that of the first step. This makes it possible to increase the temperature without controlling other conditions such as concentration used in the first step and effectively suppress the aggregation activity of the zeolite thus obtained.

According to a particularly preferred embodiment of the invention, the zeolite seed crystals formed in the first step has a particle size distribution of which a maximum value is 10 nm or less. This means that in this preparation process of a dispersion liquid of zeolite fine particles, the organic-group-containing hydrolyzable silane compound is added at the time when the dispersion liquid of zeolite seed crystals has such a particle size distribution. Fine particles having such a small particle size are highly likely to cause aggregation so that a particle size cannot be made uniform easily. In such a case, the preparation process of zeolite according to the invention can be used very usefully. A composition containing a dispersion liquid of zeolite fine particles modified with an organic group and having a particle size of approximately 120 nm or less can be filtered through a filter having a pore size of 0.2 μm without removing particles of an unusual particle size by a physical method.

According to a more preferred embodiment, the zeolite seed crystals formed in the first step has a particle size distribution of which a maximum value is 10 nm or less. A composition containing a dispersion liquid of zeolite fine particles modified with an organic group and having a particle size of approximately 30 nm or less can be filtered through a filter having a pore size of 0.05 μm without removing particles of an unusual particle size by a physical method such as centrifugal separation.

In the preparation process of a dispersion liquid of zeolite fine particles according to the invention, a ratio of a molar amount of silicon atoms of the silane compound added in the second step to the total molar amount of silicon atoms in the dispersion liquid finally prepared other than the silicon atoms of the silicon compound of the second step is 0.01 to 1. Addition of the organic-group-containing hydrolyzable silane compound in an amount within the above-described range makes it possible to suppress aggregation activity of the resulting organic-group-modified zeolite fine particles effectively while maintaining the zeolite-like physical properties sufficiently.

In the first step, preferred examples of a silicon source to be used for the formation of zeolite seed crystals in the presence of a structure directing agent include compounds represented by the following formula (1):

$$Si(OR^1)_4 \qquad (1)$$

(wherein, $R^1$s may be independently the same as or different from each other and respectively represents a linear or branched $C_{1-4}$ alkyl group). By using the above-described compounds as a silicon source, zeolite fine particles with high purity can be provided for applications, such as use for materials for semiconductor devices, in which mixing of impurities is strictly limited.

Examples of a structure directing agent preferably employed in the preparation process of zeolite fine particles according to the invention include quaternary ammonium salts represented by the following formula (2):

$$R^4_4N^+X^-  \quad (2)$$

(wherein, each of four $R^4$s may be independently the same as or different from each other and respectively represents a linear or branched $C_{1-6}$ alkyl group and X is OH, halogen, OAc or $NO_3$).

Use of these compounds facilitates definite growth of zeolite crystals.

Preferred examples of the organic-group-containing hydrolyzable silane compound to be used in the preparation process of zeolite according to the invention include compounds represented by the following formula (3):

$$R^2_nSi(OR^3)_{4-n}  \quad (3)$$

(wherein, $R^2$ represents a linear, cyclic or branched $C_{1-6}$ alkyl group or aryl group, of which some hydrogen atoms may be substituted with a fluorine atom, $R^3$ represents a linear or branched $C_{1-4}$ alkyl group, when there are plural $R^2$s or $R^3$s, each of $R^2$s or $R^3$s may be independently the same as or different from each other, and n stands for an integer from 1 to 3).

By carrying out a maturing reaction after the addition of the compound, zeolite fine particles having aggregation activity advantageously suppressed can be obtained.

Further, in one of preferred embodiments of the invention, there is provided a preparation process of a dispersion liquid of zeolite fine particles modified with an organic group, wherein a compound represented by the following formula (4):

$$Si(OR^5)_4  \quad (4)$$

(wherein, each of four $R^5$s may be independently the same as or different from each other respectively represents a linear or branched $C_{1-4}$ alkyl group) is added simultaneously with the organic-group-containing hydrolyzable silane compound. In the process of the invention, the particle size of zeolite fine particles in the reaction system can be grown continuously in the maturing reaction even by the addition of the organic-group-containing hydrolyzable silane compound. By adding the compound of the formula (4) while adjusting the addition amount depending on the intended particle size, zeolite fine particles modified with an organic group and having a preferred particle size can be prepared.

In the invention, there is also provided a dispersion liquid of zeolite fine particles modified with an organic group which dispersion liquid is prepared by the above-described preparation process. Compared with the zeolite fine particles obtained by the conventional method, the zeolite fine particles of the invention contain few particles having an excessively large particle size which will otherwise appear as a result of abnormal growth and aggregation and they have therefore a uniform particle size, One of the important applications of the organic-group-modified zeolite fine particles prepared by the above-described preparation process is that to a film-forming composition.

In one of the preferred embodiment of the invention, there is provided a dispersion liquid of zeolite fine particles modified with an organic group, which dispersion liquid is prepared by forming zeolite fine particles by a synthesis reaction, preparing a dispersion liquid without using physical removing means of particles having an unusual particle size, and filtering the dispersion liquid through a filter having a pore size of 0.2 μm or less. It was conventionally impossible to filter a dispersion liquid containing zeolite fine particles through a filter having such a small pore size without using physical separation means, such as centrifugal separator, of particles having an unusual particle size so that filtration on a large scale was impossible. The zeolite dispersion liquid filtered through such a filter with a small pore size is highly reliable against abrupt mixing of foreign matters, compared with that treated only with the conventional method using a centrifugal separator.

Further in the invention, there is also provided a zeolite-containing-film-forming composition obtained by forming a dispersion liquid of zeolite fine particles in accordance with the above-described process, preparing a composition containing zeolite fine particles modified with an organic group without using physical separation means of particles having an unusual particle size, and filtering the composition through a filter having a pore size of 0.2 μm or less. It has conventionally been thought that a zeolite-containing composition cannot be filtered through such a small-pore-size filter. The composition containing zeolite fine particles modified with an organic group according to the invention can however be filtered through such a filter so that it has high reliability against abrupt mixing of foreign matters.

In one mode of useful application of the invention, there is provided a porous silicon-containing film obtained by applying the composition of the invention onto a substrate and then burning the substrate. The porous silicon-containing film of the invention has high smoothness so that it is used advantageously for the fabrication of a semiconductor in accordance with a minute pattern rule.

The porous silicon-containing film is formed by a process having a step of applying the composition of the invention onto a substrate to form a thin film and a step of burning the thin film.

Further, as one useful mode of the porous silicon-containing film in the invention, the invention provides a semiconductor device having a porous silicon-containing film obtained by applying the composition of the invention onto a substrate and then burning the substrate. As described above, the porous silicon-containing film of the invention has high smoothness so that generation of defects in the semiconductor device can be prevented and a semiconductor device having high reliability can be obtained.

In the invention, there is also provided a manufacturing process of a semiconductor device having a step of applying the composition of the invention onto an intermediate substrate for semiconductor manufacture having metal interconnect layers to form a thin film and a step of burning the thin film to form a porous silicon-containing film. The above-described porous silicon-containing film can be converted into a low-dielectric-constant dielectric film between metal interconnects by forming a film on an intermediate substrate for semiconductor manufacture having metal interconnect layers and then processing the film in a similar manner to that employed for a CVD film or SOG film.

According to the synthesis process of the organic-group-substituted zeolite of the invention, growth of the zeolite fine particles can be terminated at the time when they grow to a desired particle size while having few particles with an unusually large particle size. The organic-group-substituted zeolite fine particles prepared by this process has high stability against aggregation compared with zeolite fine particles synthesized and taken out by the conventional process and including organic-group-substituted ones.

Moreover, the preparation process of zeolite fine particles according to the invention can readily provide zeolite fine particles which cannot be obtained easily in a usual manner, more specifically, zeolite fine particles having a particle size of 80 nm or less while substantially free of particles having a markedly large particle size. When film formation is carried out using a low-dielectric-constant dielectric film-forming composition obtained in accordance with the above-described process, a porous low-dielectric-constant film with high smoothness is available.

In another aspect of the invention, a dispersion liquid of zeolite fine particles filtered through a filter having a pore size of 0.2 μm or less, which can be available on an increased scale by the invention, or a film-forming composition containing the dispersion liquid has high reliability compared with those prepared by the conventional process, because abrupt mixing of foreign matters from outside does not occur.

DETAILED DESCRIPTION OF THE PREFERRED EMBODIMENT

Figure 1:
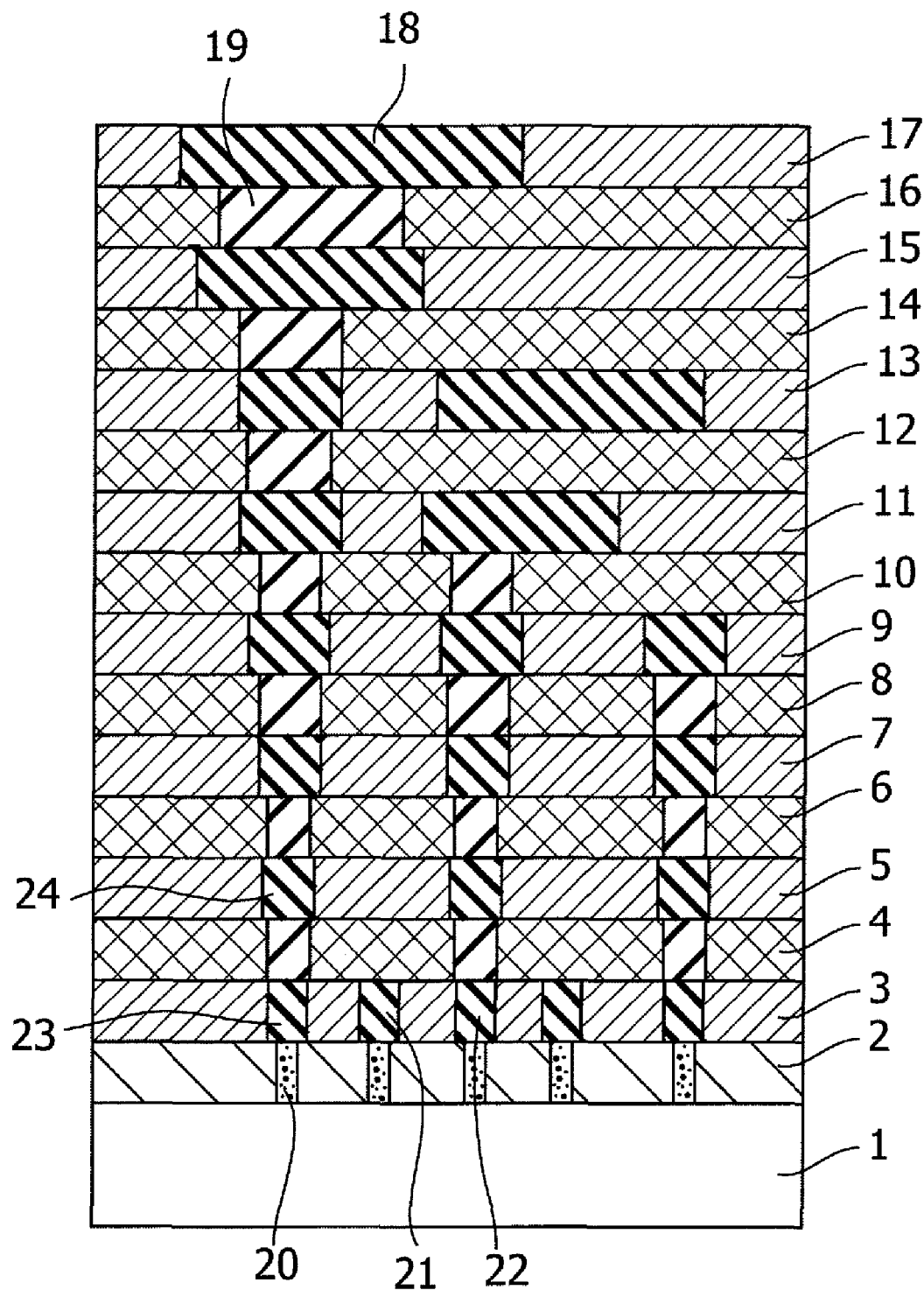
FIG. 1 is a schematic cross-sectional view illustrating an embodiment of a semiconductor device according to the invention.

The present invention now will be described more fully hereinafter. However, this invention may be embodied in many different forms and should not be construed as limited to the embodiments set forth herein; rather, these embodiments are provided so that this disclosure will satisfy applicable legal requirements. Like numbers refer to like elements throughout. As used in this specification and the claims, the singular forms "a," "an," and "the" include plural referents unless the context clearly dictates otherwise.

First, the preparation process of organic-group-modified zeolite fine particles according to the invention will be described below.

In addition to the processes described below, a number of known processes using silica or the like are known as a process for forming zeolite crystals. The most preferred process to be applied to the first step of the invention for forming zeolite seed crystals having a particle size of 80 nm or less in the presence of a structure directing agent is a process for forming crystals by hydrolysis and condensation of a hydrolyzable silane compound in the presence of a structure directing agent. In this process, silane molecules obtained by the hydrolysis in the reaction mixture gather around the structure directing agent and constitute a metastable state with regularity and then, condensation and crystallization proceeds simultaneously.

Any hydrolyzable silane compound is basically usable for this process insofar as all the bonds of silicon atoms become silanol or Si—O—Si bond as a result of hydrolysis. Alkoxysilane compounds are however preferred in order to minimize the amount of impurities such as halogen and alkali metal when the resulting product is used as electronic materials and the like. More preferred examples of the raw material include silane compounds represented by the following formula (1):

$$Si(OR^1)_4 \quad (1)$$

(wherein, $R^1$s may be the same or different and each independently represents a linear or branched $C_{1-4}$ alkyl group).

Specific examples include, but not limited to, tetramethoxysilane, tetraethoxysilane, tetrapropoxysilane, tetrabutoxysilane, tetraisopropoxysilane, tetraisobutoxysilane, triethoxymethoxysilane, tripropoxymethoxysilane, tributoxymethoxysilane, trimethoxyethoxysilane, trimethoxypropoxysilane, and trimethoxybutoxysilane.

Many structure directing agents to be used for the synthesis of zeolite are publicly known. Most preferred examples include quaternary organic ammonium hydroxides represented by the following formula (2):

$$R^4_4 N^+ X^- \quad (2)$$

(wherein, $R^4$s may be the same or different and each independently represents a linear or branched $C_{1-6}$ alkyl group and X is OH, halogen, OAc or $NO_3$).

Specific examples of $R^4$ include methyl, ethyl, propyl and butyl groups. Especially preferred examples of such a structure directing agent include, but not limited to, tetramethylammonium hydroxide, tetraethylammonium hydroxide, tetrapropylammonium hydroxide, tetrabutylammonium hydroxide, triethylmethylammonium hydroxide, tripropylmethylammonium hydroxide and tributylmethylammonium hydroxide.

In the preparation process of zeolite fine particles according to the invention, the structure directing agent is used as a mixture with the silane compound. The structure directing agent is added in an amount of preferably from 0.01 to 2 moles, more preferably from 0.1 to 1 mole per mole of the silane compound represented by the formula (1).

Condensation is conducted preferably under basic conditions. A basic catalyst accelerates hydrolysis and condensation reactions. When as the above-described structure directing agent, a structure directing agent having a hydroxy ion as the counter anion is used, the structure directing agent itself may be functioned as a basic catalyst. A basic catalyst may be added separately.

As the basic catalyst, preferred are, in addition to the structure directing agent, compounds represented by the following formula (5):

$$(R^6)_3 N \quad (5)$$

(wherein, $R^6$s may be the same or different and each independently represents a hydrogen atom or a linear, branched or cyclic $C_{1-20}$ alkyl or aryl group, with the proviso that the hydrogen atom contained therein may be substituted with a hydroxy or amino group) and compounds represented by the following formula (6):

$$(R^7)_n X \quad (6)$$

(wherein, $R^7$s may be the same or different and each independently represents a hydrogen atom or a linear, branched or cyclic $C_{1-20}$ alkyl or aryl group, with the proviso that the hydrogen atom contained therein may be substituted with a hydroxy or amino group; n stands for an integer from 0 to 3; and X represents an n-valent heterocyclic compound containing one or more nitrogen atoms).

Examples of $R^6$ include, but not limited to, hydrogen atom, and methyl, ethyl, propyl, isopropyl, butyl, isobutyl, pentyl, hexyl, heptyl, octyl, decyl, dodecyl, octadecyl, cyclohexyl, phenyl and tolyl groups.

Examples of the basic catalyst represented by the formula (5) include ammonia, methylamine, ethylamine, propylamine, butylamine, pentylamine, dodecylamine, octadecylamine, isopropylamine, t-butylamine, ethylenediamine, 1,2-diaminopropane, 1,3-diaminopropane, hexamethylenediamine, dimethylamine, diethylamine, dipropylamine, diisopropylamine, dibutylamine, trimethylamine, triethylamine, tripropylamine, tributylamine, N,N-dimethyloctylamine, triethanolamine, cyclohexylamine, aniline, N-methylaniline, diphenylamine and toluidines.

Examples of $R^7$ include hydrogen atom and methyl, ethyl, propyl, isopropyl, butyl, isobutyl, pentyl, hexyl, heptyl, octyl, decyl, dodecyl, octadecyl, cyclohexyl, phenyl, tolyl, amino, methylamino, ethylamino, propylamino, butylamino, pentylamino, dodecylamino, octadecylamino, isopropylamino, tert-butylamino, dimethylamino, diethylamino, dipropylamino, diisopropylamino, dibutylamino, N,N-dimethyloctylamino, cyclohexylamino, and diphenylamino groups.

Examples of X include, but not limited to, pyrrolidine, piperidine, morpholine, pyridine, pyridazine, pyrimidine, pyrazine and triazine.

Examples of the basic catalyst represented by the formula (6) include, but not limited to, DBU, DBN, pyrrolidine, piperidine, morpholine, pyridine, picolines, phenylpyridines, N,N-dimethylaminopyridine, pyridazine, pyrimidine, pyrazine, and triazine.

As the basic catalyst to be used in the process of the invention, especially preferred examples of include TMAH (tetramethylammonium hydroxide), ammonia, methylamine, ethylamine, propylamine, isopropylamine, pyrrolidine, piperidine, morpholine, pyridine, DBU and DBN. By using these catalysts, zeolite fine particles can be prepared without being contaminated with an impurity metal.

The amount of the basic catalyst is preferably from 0.01 to 20 moles, more preferably from 0.05 to 10 moles per mole of the silane compound represented by the formula (1). The above-described basic catalysts may be used either singly or in combination.

When fine zeolite crystals are prepared by hydrolysis and polymerization of the silane compound of the formula (1) in the preparation process of zeolite fine particles according to the invention, water necessary for hydrolysis is added as well as the silane compound, structure directing agent and basic catalyst. When the structure directing agent or basic catalyst is added, it is sometimes added in the form of an aqueous solution. Water is added in an amount of preferably from 0.1 to 100 times the mass, more preferably from 0.5 to 20 times the mass based on the mass of the silane compound.

When zeolite seed crystals are prepared by the hydrolysis and condensation of the silane compound of the formula (1), a solvent other than water such as alcohol can be added. Examples include methanol, ethanol, isopropyl alcohol, butanol, propylene glycol monomethyl ether, propylene glycol monopropyl ether, propylene glycol monopropyl ether acetate, ethyl lactate and cyclohexanone.

The solvent may be added in an amount of preferably from 0.1 to 100 times the mass, more preferably form 0.5 to 20 times the mass based on the mass of the silane compound.

The hydrolysis time is from 1 to 100 hours, preferably from 10 to 70 hours, while the temperature is from 0 to 50° C., preferably from 15 to 30° C. The heat treatment after the hydrolysis, that is, the reaction to form crystals in the first step is performed at a temperature of 30° C. or greater, preferably 50° C. or greater but not greater than 80° C. The heat treatment time varies, depending on the desired particle size, but an appropriate one can be found in a range of from 1 to 100 hours, more preferably from 5 to 20 hours. Heat treatment temperature of 80° C. greater allows mixing of considerably large zeolite crystals.

Next, completion of the first step will be described.

The first step must be completed after zeolite seed crystals are formed but before zeolite having an unusually large particle size is formed. In order to enable the real filtration, through a 0.2 μm filter, of a solution containing organic-group-substituted zeolite fine particles prepared according to the invention as a final product, the peak as determined by particle size measurement is preferably 10 nm or less, more preferably 5 nm or less. If so, a solution filterable through a 0.05 μm filter can be prepared.

When the zeolite fine particles obtained as a final product are used as a material for a so-called 45 nm pattern rule or 32 nm pattern rule semiconductor devices, a proportion of zeolite fine particles having a particle size of 100 nm or greater is desirably 1 mass % or less in order to keep homogeneity of a film. When the particles having a particle size distribution peak of 5 nm or less as a result of particle size measurement, the zeolite fine particles available after the subsequent step can satisfy the above-described requirement. Although any known method capable of measuring particles within the above-described range can be employed, they can be measured, for example, by a dynamic light scattering method and "Nanotrac" manufactured by Nikkiso can be used for the measurement.

Sampling during the reaction can be conducted easily. The growth of crystals is terminated by decreasing the temperature to room temperature or less so that the particle size of zeolite seed crystals can be measured after stopping the growing reaction during the reaction. The particle size distribution can be measured by the dynamic light scattering method as described above. When the target size is smaller than the measurement range of an apparatus to be used for the measurement, two points within a measurable particle-size range are set in advance based on the imaged particle size distribution and the peak of the particle size can be expected roughly from comparison of the two points. In this stage, aggregation is presumed to occur but experience shows that when fine particles are not taken out from the reaction system, the aggregation occurs reversibly and variations in measured values do not occur by the treatment for particle size measurement.

The crystal growth rate is not so high under the above-described conditions so that a reaction mixture during the crystal growth reaction may be sampled and subjected to particle size measurement as is if it is performed as promptly as possible. After determination of the conditions such as concentration of the reaction mixture or temperature, the particle size can be controlled roughly by controlling the reaction time without actual measurement of the particle size so that particle size measurement during the step after determination of the conditions is not necessary.

The second step of adding an organic-group-containing hydrolyzable silane compound and a third step of carrying out a maturing reaction will next be described. The growth of zeolite is not terminated immediately by the addition of the hydrolyzable silane compound substituted with an organic group in the second step. By the maturing reaction in the third step, zeolite fine particles are grown to some extent and at the same time, stabilized without forming zeolite fine particles having an unusually large particle size.

When seed crystals of zeolite are prepared by the first step, the organic-group-containing hydrolyzable silane compound is added.

The organic group may be a substituted or unsubstituted hydrocarbon. Examples include aliphatic hydrocarbon groups, aromatic hydrocarbon groups, aliphatic hydrocarbon groups substituted with an aromatic hydrocarbon group, and aromatic hydrocarbon groups substituted with an aliphatic hydrocarbon. These organic groups have a strong interaction with the structure directing agent. They may contain a heteroatom-containing substituent insofar as the substituent is not a group such as carboxyl group. Examples of such a substituent include halogens such as fluorine and substituents such as alkoxy group.

More preferred examples of the organic-group-containing hydrolyzable silane compound include compounds represented by the following formula (3):

$$R^2{}_n Si(OR^3)_{4-n} \qquad (3)$$

(wherein, $R^2$(s) may be the same or different when there are plural $R^2$s and each independently represents a linear, cyclic or branched $C_{1-6}$ alkyl group or aryl group, some hydrogen atoms of which may be substituted with a fluorine atom, $R^3$(s) may be the same or different when there are plural $R^3$s and each independently represents a linear or branched $C_{1-4}$ alkyl group, and n stands for an integer from 1 to 3).

Specific examples of $R^2$ when it represents a linear or branched $C_{1-6}$ alkyl group or aryl group in the formula (3) include methyl, ethyl, propyl, isopropyl, butyl, isobutyl, sec-butyl, tert-butyl, pentyl, sec-pentyl, neopentyl, hexyl, and phenyl groups.

When growth of zeolite seed crystals is started, an excess structure directing agent is sometimes used. In such a case, at the time of adding the organic-group-containing hydrolyzable silane compound, a hydrolyzable silane compound to be used for synthesis of zeolite seed crystals, for example, a silane compound represented by the following formula (4):

$$Si(OR^5)_4 \qquad (4)$$

(wherein, $R^5$s may be the same or different and each independently represents a linear or branched $C_{1-4}$ alkyl group) may be added. It is preferably added to give a ratio from 20/35 to 200/35 (mole/mole), relative to the amount of the structure directing amount, in the reaction mixture after completion of the addition. Addition of it is expected to produce an effect of providing the zeolite fine crystals with a core-shell structure.

In the dispersion liquid of organic-group-modified zeolite fine particles available as a final product, the amount of the organic-group-containing hydrolyzable silane compound is preferably 0.01 (mole/mole) or greater and adequately not greater than 1.0 (mole/mole), based on the total molar amount of silicon atoms other than the silicon atoms of the organic-group-containing hydrolyzable silane compound in order to obtain zeolite fine particles which can be filtered through a filter having a pore size of 0.2 μm and have an inactivated aggregation property, though depending on the intended particle size. Although incorporation, inside of crystals, of a silicon unit substituted with an organic group will be described below, addition of a large excess of it such as an amount of 2.0 (mole/mole) or greater generates a large amount of silicon units not incorporated inside of the crystal. The silicon units substituted with a hydrocarbon group and not incorporated inside of the crystal become amorphous silica on the surface of zeolite or independently under maturing reaction conditions. They may attach to the zeolite fine particles or silica particles may cause aggregation with zeolite fine particles so that there is a danger of particles with an unusual particle size appearing with gelation. Particularly when control of the particle size to 100 nm or less is desired, for example, in the case where a thin film is used as an electronic material which requires smoothness, it is possible to easily control the particle size of zeolite crystals thus obtained to a desired one by adjusting the amount of the silane compound to 0.2 (mole/mole) or greater.

The particle size for obtaining zeolite fine particles which can be filtered through a filter having a pore size of 0.2 μm and have an inactivated aggregation property is preferably set at from 5 to 120 nm.

At the time of adding the organic-group-containing hydrolyzable silane compound to the reaction mixture during growth of zeolite crystals, the hydrolyzable silane compound may be added after temperature reduction or may be added without changing the growth reaction temperature of zeolite seed crystals if mixing proceeds smoothly.

In the third step for maturing, the reaction temperature is adjusted to be higher than the growth reaction temperature of zeolite seed crystals. A temperature elevating operation itself is easy, but it is sometimes not carried out smoothly by the influence of an alcohol or the like mixed in the reaction system of the first step. Although this problem can be overcome by adjustment of the composition ratio of the solvent, addition of an auxiliary solvent or the like, pressurization facilitates temperature elevation. An adequate pressurized condition is formed by decreasing the temperature of the reaction mixture, at the time of adding the compound thereto, to a temperature by preferably 10° C., more preferably 20° C. lower than the reaction temperature used for the maturing reaction or still more preferably to room temperature, hermetically sealing a vessel, and then heating it to a maturing temperature. This facilitates formation of the pressurized condition and elevation of the reaction mixture.

The reaction temperature of the maturing reaction varies depending on the ultimately desired particle size. In order to obtain only zeolite fine particles with a very small particle size, the temperature in the first step is adjusted to be low, but the maturing reaction in the third step is preferably performed within a temperature range higher than the first step but not too high. The temperature range is preferably 80° C. or greater but not greater than 200° C. It is more preferably from 85 to 150° C., at which the reaction time is preferably from about 12 to 72 hours.

The organic-group-containing hydrolyzable silane compound, as disclosed in Patent Document 3, stays on the surface of zeolite during its addition and acts as a surface treatment agent when the maturing treatment is not so strong. When reaction conditions for the growth of zeolite crystals are maintained, as the maturing reaction, for a predetermined time at a temperature higher than that of the first step, on the other hand, silane having an organic group is presumed to be incorporated in the zeolite crystals and causes a drastic change in their physical properties. In other words, on the surface of the zeolite crystals, activity for forming an irreversible aggregation state is suppressed significantly compared with that without this operation.

The suppressing mechanism of irreversible aggregation has not been confirmed sufficiently, but the present inventors consider that this mechanism occurs because of the following reason. When silane having a substituent not showing a strong interaction with a structure directing agent is incorporated in a silane associate which has been formed by the action of the structure directing agent and is forming a zeolite-like recurring structure, a silanol density on the surface of zeolite fine crystals which are growing decreases. This weakens the hydrophilicity at this portion and weakens an interaction with water molecules or alkali catalyst (structure directing agent), reduces a surface energy, heightens stability of zeolite fine particles themselves, and weakens the association between silanols or zeolite fine crystals, resulting in retardation of an aggregation rate and a rate of subsequent chemical bond formation between zeolite fine crystals.

The particle size of organic-group-modified zeolite fine particles obtained in the above-described maturing reaction has grown further from the particle size of seed crystals. The growth is influenced by an additionally added tetravalent silane compound such as that represented by the following formula (4):

$$\text{Si}(\text{OR}^5)_4 \quad (4)$$

(wherein, $R^5$s may be the same or different and each independently represents a linear or branched $C_{1-4}$ alkyl group), reaction temperature and the size of an organic group of the organic-group-containing hydrolyzable silane compound. The present inventors consider that this mechanism occurs because of the following reasons. Growth of zeolite fine particles retards drastically when the organic-group-containing hydrolyzable silane compound is incorporated in the crystal structure under equilibrium in which bond formation and breakage occur speedily in the peripheral portion of zeolite fine particles where the disorder of crystals is large. When an organic group selected is a methyl group or the like small in size, it is incorporated in the crystal structure relatively easily so that zeolite fine particles have a small particle size. Similarly, since the additional tetravalent silane compound reduces the incorporation opportunity of a silicon unit substituted with an organic group, it promotes growth and a temperature increase raises the incorporation opportunity. The temperature increase may cause an abnormal growth of zeolite fine particles which have not been inactivated sufficiently so that the condition must be selected carefully. The organic group of a too large size, on the other hand, may cause gel formation which is presumed to occur due to slow incorporation so that careful observation must be necessary. The intended particle size of zeolite fine particles modified with the organic group can be controlled by regulating conditions while considering the above-described factors.

In order to prepare a film-forming composition from the dispersion liquid of zeolite fine particles according to the invention, the dispersion liquid of zeolite fine particles is subjected to metal removing treatment or solvent exchange treatment to prepare a coating solution.

There are a number of known methods for metal removal and any method is basically usable. Preferred methods include use of an ion exchange resin or metal-ion-removing filter and addition of an organic solvent separable from water, followed by washing with water. Examples of the organic solvent separable from water include pentane, hexane, benzene, toluene, methyl ethyl ketone, methyl isobutyl ketone, 1-butanol, ethyl acetate, butyl acetate, and isobutyl acetate. They may be used as a mixture if necessary.

The dispersion liquid of organic-group-modified zeolite fine particles according to the invention washed with water is then converted in a known manner into a dispersion liquid in a solvent suited for coating. Examples of the solvent used for such a purpose include aliphatic hydrocarbon solvents such as n-pentane, isopentane, n-hexane, isohexane, n-heptane, 2,2,2-trimethylpentane, n-octane, isooctane, cyclohexane and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene and n-amylnaphthalene; ketone solvents such as acetone, methyl ethyl ketone, methyl n-propyl ketone, methyl n-butyl ketone, methyl isobutyl ketone, cyclohexanone, 2-hexanone, methylcyclohexanone, 2,4-pentanedione, acetonylacetone, diacetone alcohol, acetophenone, and fenthion; ether solvents such as ethyl ether, isopropyl ether, n-butyl ether, n-hexyl ether, 2-ethylhexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether; ester solvents such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvents such as N-methylformamide, N,N-dimethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. They may be used either singly or in combination.

There are already many known methods for solvent exchange and any one is basically usable insofar as it does not allow a state where no solvent is present during the exchange. It is the common practice to add a portion or all of a solvent to be used as a next solvent and conduct concentration under reduced pressure to remove the solvent to be removed. This exchange operation may be performed once or a plurality of times. Moreover, the concentrate added with the above-described solvent or another solvent as needed may be provided as a base solution for preparing a composition.

Fine zeolite crystals thus obtained cause partial irreversible aggregation during preparation or storage term of a film-forming composition after synthesis of ordinary fine crystals or they may originally contain particles having an unusually large particle size. Even if a suspension having particles whose particle size peak is, for example, 10 nm or less is prepared using these crystals, it fails to be filtered through a filter having a pore size of 0.2 μm owing to clogging of the filter with the aggregated particles. With respect to the zeolite fine particles prepared by the process of the invention, on the other hand, when the particle size peak of zeolite seed crystals obtained in the first step is adjusted to 10 nm or less, even if they are grown to have a particle size peak of 120 nm at the time the maturing reaction, the composition solution containing them can be filtered through a filter having a pore size of 0.2 μm. Further, when the particle size peak of the zeolite seed crystals obtained in the first step is adjusted to 5 nm or less, the composition solution containing zeolite fine particles grown to have a particle size peak of about 30 nm at the maximum can be filtered through a 0.05-μm filter.

Use of zeolite fine particles thus prepared facilitates preparation of a composition from which foreign particles can be removed by filtration through a filter without using means for separating substances having a usual particle size such as centrifugation or the like unsuited for scale-up even though the materials used are industrially obtained ones. It also becomes possible to smoothen the surface condition of a film containing fine particles by adjusting the particle size of the fine particles to an intended one.

The zeolite fine particles thus prepared form neither large crystal particles nor a crystal grain boundary even after growth of a zeolite crystal structure by dry gel conversion, which will be described later, after film formation so that they can be used usefully not only for a porous low-dielectric-constant film-forming composition which will be described below but also zeolite seed crystals for forming a substance separation membrane as described in Patent Document 4. They will be useful for various purposes in addition.

The zeolite fine particles of the invention are particularly useful as a porous low-dielectric-constant film-forming composition to be used in semiconductor devices in which they are required to have a uniform particle size for attaining smoothness. There are already some known examples of the zeolite-containing porous low-dielectric-constant film-forming composition (for example, Non-patent Document 1 and Patent Documents 1 and 3) and the zeolite fine particles of the invention can be used for any of them.

The zeolite-containing film-forming composition of the invention is prepared from the dispersion liquid of organic-modified zeolite fine particles according to the invention and it may further contain a binder or a modifier such as surfactant as needed.

As a binder to be added to the film-forming composition of the invention, many organosiloxane resins to be used as a material for an organosilicon low-dielectric-constant film are already known and any of them is basically usable. Polysiloxane having no organic group is also usable if it can be dissolved in a coating solvent. As the binder, either the organosiloxane resin prepared separately from zeolite may be added or as described in Patent Document 1 or 3, the organic-group-containing hydrolyzable silane compound bonded partially or wholly to zeolite fine particles by condensation may be added One example of the organosiloxane resins as described above include hydrolysis and condensation products obtained by hydrolyzing, in the presence of a basic compound and water, a starting raw material composed mainly of at least one silane compound selected from the group consisting of compounds represented by the following formulas (7), (8) and (9):

   (7)

(wherein, R(s) and $R^8$s may be the same or different and each independently represents a monovalent organic group and a stands for an integer of 1 or 2),

   (8)

(wherein, $R^9$s may be the same or different and each independently represents a monovalent organic group), and

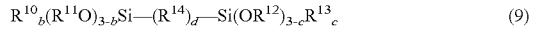   (9)

(wherein, $R^{10}$(s) to $R^{13}$(s) may be the same or different and each represents a monovalent organic group; b and c may be the same or different and each stands for 0 to 2, $R^{14}$ represents an oxygen atom, phenylene group or a group represented by —$(CH_2)_n$— (n stands for an integer from 1 to 6), and d stands for 0 or 1).

R, $R^{10}$ and $R^{13}$ are each a monovalent organic group and preferred examples of it include substituted or unsubstituted $C_{1-12}$ alkyl groups, aryl groups, aralkyl groups, alkenyl groups, epoxy-containing alkyl groups, amino-containing alkyl groups and these groups, some or all of the hydrogen atoms of which have been substituted with a halogen atom. Preferred specific examples include methyl, ethyl, propyl and phenyl.

$R^8$, $R^9$, $R^{11}$ and $R^{12}$ are preferably $C_{1-6}$ alkyl groups, especially preferably methyl, ethyl, isopropyl and iso-propenyl groups from the viewpoint of controllability of hydrolysis and condensation reaction.

Specific examples of the hydrolyzable silane compounds represented by the formulas (7) to (9) include methyltrimethoxysilane, methyltriethoxysilane, methyltripropoxysilane, methyltripropenoxysilane, ethyltrimethoxysilane, ethyltriethoxysilane, ethyltripropoxysilane, ethylpropenoxysilane, propyltrimethoxysilane, propyltriethoxysilane, propyltri-iso-propoxysilane, propyltrimethoxysilane, iso-propyltriethoxysialne, iso-propyltripropoxysilane, iso-propyltripropenoxysilane, n-butyltrimethoxysilane, n-butyltriethoxysilane, n-butyltripropoxysilane, n-butyltripropenoxysilane, sec-butyltrimethoxysilane, sec-butyltriethoxysilane, sec-butyltripropoxysilane, sec-butyltripropenoxysilane, iso-butyltrimethoxysilane, iso-butyltriethoxysilane, iso-butyltripropoxysilane, iso-butyltripropenoxysilane, phenyltrimethoxysilane, phenyltriethoxysilane, phenyltripropoxysilane, phenyltripropenoxysilane, tetramethoxysilane, tetraethoxysilane, tetrapropoxysilane, tetrapropenoxysilane, dimethyldimethoxysilane, dimethyldiethoxysilane, dimethyldipropoxysilane, dimethyldipropenoxysilane, diethyldimethoxysilane, diethyldiethoxysilane, diethyldipropoxysilane, diethyldipropenoxysilane, dipropyldimethoxysilane, dipropyldiethoxysilane, dipropyldipropoxysilane, dipropyldipropenoxysilane, diphenyldimethoxysilane, diphenyldiethoxysilane, diphenyldipropoxysilane and diphenyldipropenoxysilane.

The hydrolysates of the hydrolyzable silane compound are, for example, the hydrolyzable silane compounds represented by the formulas (7) to (9) having some or all of the hydrolyzable groups thereof substituted with a hydroxyl groups.

The condensates available by condensation of them do not form, at all the hydrolysis positions thereof, an Si—O—Si bond but are compounds having a hydrolyzable group and/or hydroxyl group. When many of the raw materials supplied for hydrolysis have 3 or 4 hydrolyzable groups, the number of silanol groups which the condensate has increases so that a raw material mixture having 3 or 4 hydrolyzable groups amounts to preferably from 70 to 100 mole % of the raw material mixture of the organosiloxane resin.

A preparation process of a polymer by hydrolysis will next be described.

A preferred condensate is obtained by hydrolysis of the hydrolyzable silane compounds of the formulas (7) to (9) in the presence of a basic catalyst. Examples of the basic substance to be preferably used as a catalyst for hydrolysis and condensation include tetraalkylammonium hydroxides such as tetramethylammonium hydroxide, tetraethylammonium hydroxide, tetrapropylammonium hydroxide and tetrabutylammonium hydroxide, aliphatic cyclic organoamines such as piperidine, 1-methylpiperidine, 2-methylpiperidine, 3-methylpiperidine, 4-methylpiperidine, piperazine, 1-methylpiperazine, 2-methylpiperazine, 1,4-dimethylpiperazine, pyrrolidine, 1-methylpyrrolidine, diazabicyclooctane, diazabicyclononane, diazabicycloundecene, 2-pyrazoline, 3-pyrroline and quinuclidine, and metal hydroxides such as sodium hydroxide, potassium hydroxide, lithium hydroxide and cesium hydroxide. Of these, tetramethylammonium hydroxide, tetraethylammonium hydroxide, tetrapropylammonium hydroxide and tetrabutylammonium hydroxide, piperidine, 1-methylpiperidine, piperazine, 1-methylpiperazine, 1,4-dimethylpiperazine, pyrrolidine, 1-methylpyrrolidine, diazabicyclooctane, diazabicyclononane, diazabicycloundecene, sodium hydroxide, potassium hydroxide and lithium hydroxide are especially preferred from the viewpoint of adhesion of the silica film to a substrate. These basic compounds may be used either singly or in combination. Of the above-described basic compounds, tetraalkylammonium hydroxides such as tetramethylammonium hydroxide, tetraethylammonium hydroxide, tetrapropylammonium hydroxide and tetrabutylammonium hydroxide which are quaternary ammonium salts and amines such as diazabicyclooctane, diazabicyclononane, and diazabicycloundecene are especially preferred bases.

The amount of the basic compound is preferably from 0.1 to 50 mass %, more preferably from 1 to 20 mass %, based on the mass of the silicon compound to be supplied for hydrolysis in terms of the complete hydrolysis and condensation product thereof, from the viewpoint of the productivity. When the amount is smaller than the above-described range, it takes to much time to complete the reaction, while the amount exceeding the above-described range is likely to cause gelation during preparation.

Water supplied for hydrolysis is from 50 to 500 mole %, more preferably from 100 to 500 mole % based on the mass of one or more silicon compounds, in terms of the complete hydrolysis and condensation product thereof, selected from the group consisting of hydrolyzable silane compounds represented by the formulas (7) to (9), hydrolysates thereof, and partial condensates thereof supplied to the reaction. The amount of water smaller than the above-described range may lead to deterioration in film strength, while the amount exceeding the above-described range may tend to cause gelation.

The term "mass in terms of the complete hydrolysis and condensation product" means that when $R_a Si(OR^8)_{4-a}$ is converted to $R_a SiO_{(4-a)/2}$.

Although the kind of a hydrolysis solvent, if it is used, is not limited particularly, hydrolysis in the homogeneous system is preferred in order to obtain a polymer having uniform properties. A solvent capable of maintaining a uniform solution state from the starting to the completion of the reaction is preferred.

Examples include alcohols such as methanol, ethanol, propanol and butanol; ether solvents such as dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether, ester solvents such as ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, and methoxytriglycol acetate, nitrogen-containing solvents such as N-methylformamide, N,N-dimethylformamide, acetamide, N-methylacetamide, N,N-dimethylacetamide, N-methylpropionamide, and N-methylpyrrolidone, and sulfur-containing solvents such as thiophene, tetrahydrothiophene, dimethyl sulfoxide, sulfolane, and 1,3-propanesultone. These solvents may be used either singly or in combination.

When the hydrolysis solvent is used, it is added preferably from 50 to 5000 mass %, more preferably from 1500 to 2000 mass % based on the mass in terms of the complete hydrolysis and condensation product.

Amounts of the solvent smaller than the above-described range may tend to cause gelation during preparation, while amounts greater than the above-described range are sometimes not practical because of a low productivity.

It is preferred to carry out a hydrolysis and condensation reaction by continuously or intermittently adding a solution containing the hydrolyzable silane compound to a solution containing the basic compound and water. Alternatively, a portion of the solution containing the basic compound and water may be added simultaneously with the solution containing the hydrolyzable silane compound. The reaction temperature upon addition is typically from 0 to 100° C., preferably from 15 to 90° C.

As described in Patent Documents 1 to 3, the composition having the organosiloxane resin and the zeolite fine particles of the invention mixed therein may be prepared either by preparing them respectively and then mixing or by adding the zeolite fine particles in advance to the reaction system during the preparation of the siloxane resin.

When a porous low-dielectric-constant film-forming composition is prepared using the organosiloxane resin serving as a binder and the organic-group-modified zeolite fine particles of the invention, it is preferred to adjust the mass of the zeolite fine particles in the dispersion liquid of the zeolite fine particles modified with an organic group according to the invention to 0.5 or greater relative to the mass of the organosiloxane resin in order to obtain film properties attributable to the addition of zeolite, especially, mechanical strength and low dielectric constant properties. As described later, the zeolite fine particles of the invention can be formed into a film without addition of the resin so that the amount of the organosiloxane resin may be zero.

The aggregation property of the zeolite fine particles of the invention is suppressed, but it is impossible to weigh their dry weight and re-disperse them in a solvent. A portion of the dispersion liquid of the zeolite fine particles is sampled as a uniform dispersion state and the mass of the zeolite fine particles contained in it is weighed. The addition amount is determined based on the mass.

Zeolite fine particles different in average particle size may be used in combination as needed. In this case, they can be mixed at a arbitrary ratio, depending on the physical properties of the zeolite fine particles or physical properties of an intended porous film.

A special method of using the dispersion liquid of the organic-group-modified zeolite fine particles according to the invention, particularly having an average particle size of 30 µm or less, further particularly 10 µm or less is application of it to a composition substantially free of the binder. Zeolite fine particles are usually likely to aggregate so that film formation using the composition substantially free of a binder may cause defects due to aggregated particles or substantial surface roughening. They may sometimes easily lead to a partial loss of a film. Use of the zeolite fine particles of the invention having a uniform particle size, on the other hand, does not cause such problems so that a film-forming composition substantially free of a binder can be prepared.

A thin film with an arbitrary film thickness can be formed by controlling the concentration of the solute of such a film-forming composition and spin coating it at an adequate rotation number.

A thin film having a thickness of typically from approximately 0.1 to 1 µm is formed as an actual film thickness but the film thickness is not limited to it. A thin film with an increased thickness can be formed, for example, by spin coating a plurality of times.

Examples of the solvent used for dilution include aliphatic hydrocarbon solvents such as n-pentane, isopentane, n-hexane, isohexane, n-heptane, 2,2,2-trimethylpentane, n-octane, isooctane, cyclohexane and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene and n-amylnaphthalene; ketone solvents such as acetone, methyl ethyl ketone, methyl n-propyl ketone, methyl n-butyl ketone, methyl isobutyl ketone, cyclohexanone, 2-hexanone, methylcyclohexanone, 2,4-pentanedione, acetonylacetone, diacetone alcohol, acetophenone, and fenthion; ether solvents such as ethyl ether, isopropyl ether, n-butyl ether, n-hexyl ether, 2-ethylhexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether, ester solvents such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvents such as N-methylformamide, N,N-dimethylformamide, acetamide, N-methylacetamide, N,N-dimethylacetamide, N-methylpropionamide, and N-methylpyrrolidone, and sulfur-containing solvents such as dimethyl sulfide, diethyl sulfide, thiophene, tetrahydrothiophene, dimethyl sulfoxide, sulfolane, and 1,3-propanesultone. They may be used either singly or in combination.

The dilution degree differs depending on the viscosity or intended film thickness, but the solvent is usually added to give a concentration of from 50 to 99 mass %, more preferably from 75 to 95 mass %.

The thin film formed in such a manner is then heated preferably at from 50 to 150° C. for several minutes in a drying step (which is a step typically called "preburning" in a semiconductor process) to remove the solvent.

A burning step is typically performed after the drying step in order to obtain a porous low-dielectric-constant film. A number of methods are known as the burning step and any of them can be employed. The burning temperature is usually from 250 to 550° C., typically from 300 to 550° C.

When a film is formed using the zeolite-film-forming composition containing a binder or the binder-free zeolite film-forming composition, a pretreatment step may be conducted before the burning step. One of the useful methods as the pretreatment step is a method of growing or reconstructing a zeolite structure of a formed film, a so-called dry gel conversion method. For example, Japanese Patent Provisional Publication No. 2001-31416 proposes a preparation process of a substance permeable membrane having a high substance selectivity by bringing zeolite seed crystals into contact with a silica film and converting the silica film into a zeolite film in a water vapor atmosphere. The present inventors have surprisingly found that the organic-group-modified zeolite fine particles according to the invention have aggregation-suppressed properties, but act as good seed crystals at the time of growing zeolite crystals on the surface of a substrate. After preparation of a zeolite-containing film-forming composition containing the organic-group-modified zeolite fine particles of the invention, a polysiloxane which is a co-hydrolysis and condensation product of a tetraalkoxysilane and a substituted or unsubstituted alkyltrialkoxysilane, and a structure directing agent and film formation using the composition, the film is subjected to water vapor treatment, that is, a so-called dry gel conversion method. The zeolite crystals will then be a nucleus for crystal growth in the film and with the growth of the crystals, a micropore density due to zeolite in the film can be raised.

Further, when a film available from the film-forming composition substantially free of a binder and containing the organic-group-modified zeolite fine particles of the invention is treated by the dry gel conversion method, a micropore density also increases as a result of reconstruction of zeolite crystals. Particularly when the zeolite fine particles having a particle size of 50 nm or less available by the invention are used without addition of a binder, the composition is composed only of particles having a minute particle size so that the micropore density of the film obtained by direct burning is not so high. Treatment in accordance with the dry gel conversion method however heightens the micropore density efficiently and at the same time, increases mechanical strength. Such effects are prepared because a zeolite or zeolite-like crystal structure is grown by the treatment in accordance with the dry gel conversion method.

The water vapor treatment of the dry gel conversion method is usually performed by bringing water vapor of from 50 to 200° C. into contact with the film for from 1 to 100 hours, preferably for from 5 to 20 hours. When the zeolite fine particles of the invention contain a sufficient amount of a quaternary ammonium salt used in synthesis, zeolite crystals can be grown only by the treatment with water vapor. In order to promote the growth, however, an amine may be incorporated in the atmosphere. Examples of such an amine include ammonia, triethylamine, ethylenediamine, trimethylamine, methylpiperidine, N-methylpiperidine, pyrrolidine, choline and triethanolamine. The atmosphere may contain TMAH or alcohol further.

A film obtained by burning after the dry gel conversion treatment can have higher mechanical strength and more preferable low dielectric properties as a result of the growth and reconstruction of the zeolite structure, compared with those of a film available by the ordinary burning treatment without using the present step.

A low-dielectric-constant porous film to be used in semiconductor devices having pores introduced therein in order to reduce its dielectric constant, thereby being made porous has conventionally a problem that owing to a reduction in the density of the material constituting the film, the film has inevitably reduced mechanical strength. A reduction in the mechanical strength not only may adversely affect the strength of a semiconductor device itself but also may cause, because of insufficient strength of the film, peeling in chemical mechanical polishing ordinarily employed in the semiconductor manufacturing process. A porous film available using a porous film-forming composition composed mainly of a silica gel prepared in the invention process, on the other hand, actualizes a low dielectric constant and high mechanical strength simultaneously as described above so that use of it as an interlayer dielectric film of semiconductor devices enables production of a high-reliability, high-speed and compact semiconductor device, because it has high mechanical strength and low dielectric constant, though it is a porous film.

An embodiment of the semiconductor device of the invention will next be described.

FIG. 1 is a schematic cross-sectional view illustrating one example of the semiconductor device of the invention. In FIG. 1, as substrate 1, Si semiconductor substrates such as Si substrate and SOI (Si On Insulator) substrate can be employed. Alternatively, it may be a compound semiconductor substrate such as SiGe or GaAs.

Interlayer dielectric films illustrated in FIG. 1 are interlayer dielectric film 2 of a contact layer, interlayer dielectric films 3, 5, 7, 9, 11, 13, 15, and 17 of an interconnect layer, and interlayer dielectric films 4, 6, 8, 10, 12, 14, and 16 of a via layer.

Interconnect layers from the interlayer dielectric film 3 of the bottom interconnect layer to the interlayer dielectric film 17 of the uppermost interconnect layer are abbreviated as M1, M2, M3, M4, M5, M6, M7 and M8, respectively in the order from the bottom to the top.

The via layers from the interlayer dielectric film 4 of the bottom via layer to the interlayer dielectric film 16 of the uppermost via layer are abbreviated as V1, V2, V3, V4, V5, V6 and V7, respectively in the order from the bottom to the top.

Some metal interconnects are indicated by numerals 18 and 21 to 24, respectively, but even if such a numeral is omitted, portions with the same pattern as that of these metal interconnects are metal interconnects.

A via plug 19 is made of a metal and it is typically copper in the case of a copper interconnect. Even if a numeral is omitted, portions with the same pattern as that of these via plugs are via plugs.

A contact plug 20 is connected to a gate of a transistor (not illustrated) formed on the uppermost surface of the substrate 1 or to the substrate. As illustrated, the interconnect layers and via layers are stacked alternately one after another. The term "multilevel interconnects" typically means M1 and layers thereabove.

The interconnect layers M1 to M3 are typically called local interconnects; the interconnect layers M4 to M5 are typically called intermediate or semi-global interconnects; and the interconnect layers M6 to M8 are typically called global interconnects.

In the semiconductor device of the invention, the porous film of the invention is used as at least one of the dielectric films of the interlayer dielectric films 3, 5, 7, 9, 11, 13, 15, and 17 of the interconnect layers and the interlayer dielectric films 4, 6, 8, 10, 12, 14 and 16 of the via layers.

For example, when the porous film of the invention is used as the interlayer dielectric film 3 of the interconnect layer (M1), a capacitance between the metal interconnect 21 and metal interconnect 22 can be reduced greatly.

When the porous film of the invention is used as the interlayer dielectric film 4 of the via layer (V1), a capacitance between the metal interconnect 23 and metal interconnect 24 can be reduced greatly.

Thus, use of the porous film of the invention having a low dielectric constant for the interconnect layer enables drastic reduction of the capacitance between metal connects in the same layer.

In addition, use of the porous film of the invention having a low dielectric constant for the via layer enables drastic reduction in the capacitance between the metal interconnects above and below the via layer. Accordingly, use of the porous film of the invention for all the interconnect layers and via layers enables great reduction in the parasitic capacitance of interconnects.

By using the porous film of the invention as a dielectric film of interconnects, an increase in dielectric constant due to moisture absorption of the porous film does not occur at the time of forming a multilevel interconnect by stacking the porous films one after another. As a result, the semiconductor device can be operated at a high speed and low power consumption.

The porous film of the invention has strong mechanical strength so that it contributes to an improvement in the mechanical strength of semiconductor device. As a result, the semiconductor device using it can be manufactured in a higher production yield and have greatly improved reliability.

EXAMPLES

The invention will hereinafter be described in detail by Examples and Comparative Examples. It should however be borne in mind that the invention is no limited to or by them.

[Preparation of Zeolite Seed Crystals (First Step)]

Preparation Example 1

First Step

Tetraethoxysilane (208.4 g) and 474.6 g of a 15% aqueous solution of tetrapropylammonium hydroxide were mixed and stirred at room temperature for 3 days. Then, water derived from the aqueous solution and a solution formed by hydrolysis, that is, a solution of an ethanol mixture prepared by hydrolysis were heated under reflux. The temperature of the reaction system was 78° C. The reaction mixture was refluxed continuously for 10 hours to obtain a solution of zeolite seed crystals. The particle size distribution of the seed crystals of zeolite thus formed was 0.9 nm when analyzed using a "Nanotrac Particle Analyzer UPA-EX 150" (trade name; product of Nikkiso).

Comparative Preparation Example 1

As in Preparation Example 1, the raw materials were charged. After stirring at room temperature for 3 days, heating under reflux was performed for 24 hours, whereby the reaction mixture became turbid and partial precipitation of zeolite particles was observed. The particle size distribution of the zeolite fine particles contained in the supernatant portion was analyzed in a similar manner to Preparation Example 1. The particle size peak was 180 nm. In this Example, it is presumed that the zeolite crystals have grown to be stable.

[Preparation of Modified Zeolite Fine Particles (Second Step and Third Step) and Preparation of a Zeolite Film-Forming Coating Solution]

Example 1

To 50 g of the solution of zeolite seed crystals obtained in Preparation Example 1 were added 5 g of tetraethoxysilane and 8.55 g of methyltriethoxysilane. The mixture was reacted at 100° C. for 24 hours in an airtight container to yield a solution of hydrocarbon-substituted zeolite fine crystals. The particle size distribution of the resulting solution of hydrocarbon-substituted zeolite fine crystals was analyzed as in Preparation Example 1. The peak of the particle size was 20 nm. To the solution of hydrocarbon-substituted zeolite fine crystals was added 80 g of propylene glycol propyl ether. Ethanol and water were distilled off under reduced pressure, whereby a solution of the hydrocarbon-substituted zeolite fine crystals in propylene glycol propyl ether was obtained. The resulting solution was diluted with propylene glycol propyl ether so as to adjust a film thickness to 300 nm at 1500 rpm.

The zeolite film-forming coating solution was prepared. It was filtered through filters having a pore size of 0.05 µm and 0.2 µm ("Ultrahigh molecular weight polyethylene (UPE type) Microgard Minichem-D CWUZ0S1S3 (0.05µ) and CWUG0S1S3 (0.2µ)", product of Nihon Entegris), respectively. The zeolite film-forming coating solution was left to stand at room temperature for 30 days but no deterioration was observed.

Example 2

To 50 g of the solution of zeolite seed crystals obtained in Preparation Example 1 were added 7.58 g of tetraethoxysilane and 6.38 g of methyltriethoxysilane and they were reacted in an airtight container at 100° C. for 24 hours to yield a solution of hydrocarbon-substituted zeolite fine crystals. The particle size of the solution of hydrocarbon-substituted zeolite fine crystals was measured as in Preparation Example 1. The particle size had a peak at 17 nm. To the solution of hydrocarbon-substituted zeolite fine crystals was added 80 g of propylene glycol propyl ether. Ethanol and water were distilled off under reduced pressure, whereby a solution of the hydrocarbon-substituted zeolite fine crystals in propylene glycol propyl ether was obtained. The resulting solution was diluted with propylene glycol propyl ether so that the film would have a thickness of 300 nm at 1500 rpm.

The zeolite film-forming coating solution thus obtained was filtered through filters having a pore size of 0.05 µm and 0.2 µm, respectively. The zeolite film-forming coating solution was left to stand at room temperature for 30 days but no deterioration was observed.

Example 3

To 50 g of the solution of zeolite seed crystals obtained in Preparation Example 1 were added 13.64 g of tetraethoxysilane and 1.28 g of methyltriethoxysilane and they were reacted in an airtight container at 100° C. for 24 hours to yield a solution of hydrocarbon-substituted zeolite fine crystals.

The particle size of the solution of hydrocarbon-substituted zeolite fine crystals was analyzed as in Preparation Example 1. The particle size had a peak at 120 nm.

To the solution of hydrocarbon-substituted zeolite fine crystals was added 80 g of propylene glycol propyl ether and ethanol and water were distilled off under reduced pressure, whereby a solution of the hydrocarbon-substituted zeolite fine crystals in propylene glycol propyl ether was obtained.

The resulting solution was diluted with propylene glycol propyl ether so that the film would have a thickness of 300 nm at 1500 rpm. The zeolite film-forming coating solution thus obtained was filtered through a filter having a pore size of 0.2 µm. The zeolite film-forming coating solution was left to stand at room temperature for 30 days but no deterioration was observed.

Example 4

To 50 g of the solution of zeolite seed crystals obtained in Preparation Example 1 were added 5.05 g of tetraethoxysilane and 0.09 g of methyltriethoxysilane and they were reacted in an airtight container at 100° C. for 24 hours to yield a solution of hydrocarbon-substituted zeolite fine crystals showing a Tyndall phenomenon. The particle size of the solution of hydrocarbon-substituted zeolite fine crystals was analyzed as in Preparation Example 1. The particle size had a peak at 550 nm. To the solution of hydrocarbon-substituted zeolite fine crystals was added 80 g of propylene glycol propyl ether and ethanol and water were distilled off under reduced pressure, whereby a solution of the hydrocarbon-substituted zeolite fine crystals in propylene glycol propyl ether was obtained. The resulting solution was diluted with propylene glycol propyl ether so that the film would have a thickness of 300 nm at 1500 rpm.

The zeolite film-forming coating solution was left to stand for 7 days but no deterioration was observed.

Comparative Example 1

To 50 g of the suspension of zeolite seed crystals obtained in Comparative Preparation Example 1 were added 5 g of tetraethoxysilane and 8.55 g of methyltriethoxysilane and they were reacted in an airtight container at 100° C. for 24 hours to yield a suspension of hydrocarbon-substituted zeolite fine crystals. The particle size of the solution of hydrocarbon-substituted zeolite fine crystals was analyzed as in Preparation Example 1. The particle size had a peak at 190 nm. To the solution of hydrocarbon-substituted zeolite fine crystals was added 80 g of propylene glycol propyl ether and ethanol and water were distilled off under reduced pressure, whereby a solution of the hydrocarbon-substituted zeolite fine crystals in propylene glycol propyl ether was obtained.

The resulting solution was diluted with propylene glycol propyl ether so that the film would have a thickness of 300 nm at 1500 rpm.

The zeolite film-forming coating solution was prepared. The solution failed to be filtered through a 0.2 μm filter so that the unfiltered solution was provided as a coating solution. The resulting zeolite film-forming coating solution was left to stand for 7 days at room temperature, resulting in gradual precipitation of precipitates.

To 50 g of the solution of zeolite seed crystals obtained in Preparation Example 1 were added 5 g of tetraethoxysilane and 8.55 g of methyltriethoxysilane. The resulting mixture was refluxed under normal pressure and then, the reaction temperature was 76° C. After reflux for 24 hours, a solution of zeolite fine crystals modified with a silicon unit having a hydrocarbon side chain was obtained. The particle size of the resulting solution of zeolite fine crystals modified with a silicon unit having a hydrocarbon side chain was analyzed as in Preparation Example 1. The particle size had a peak at 85 nm. To the solution of zeolite fine crystals modified with a silicon unit having a hydrocarbon side chain was added 80 g of propylene glycol propyl ether. Ethanol and water were distilled off under reduced pressure, whereby a solution of the zeolite fine crystals modified with a silicon unit having a hydrocarbon side chain in propylene glycol propyl ether was obtained. The resulting solution was diluted with propylene glycol propyl ether so that the film thickness would be 300 nm at 1500 rpm.

The resulting zeolite film-forming coating solution failed to be filtered through a 0.2 μm filter so that the unfiltered solution was provided as a coating solution. The zeolite film-forming coating solution was left to stand at room temperature for 7 days, resulting in gradual precipitation of precipitates.

Comparative Example 3

To the solution of seed crystals obtained in Preparation Example 1 was added 80 g of propylene glycol propyl ether. Ethanol and water were distilled off under reduced pressure, whereby a solution of zeolite seed crystals in propylene glycol propyl ether was obtained. The resulting solution was diluted with propylene glycol propyl ether further so that the film thickness would be 300 nm at 1500 rpm.

The zeolite film-forming coating solution failed to be filtered through a 0.2 μm filter so that the unfiltered solution was provided as a coating solution. The zeolite film-forming coating solution was left to stand at room temperature for 7 days. Then, the precipitation occurred gradually.

Comparative Example 4

The solution of zeolite seed crystals obtained in Comparative Preparation 1 caused severe aggregation by solvent exchange so that no solvent exchange was performed. The solution of seed crystals itself failed to be filtered through a filter having a pore size of 0.2 μm so that the solution of zeolite seed crystals obtained in Preparation Example 3 was provided as was as a coating solution. The zeolite film-forming coating solution was allowed to stand at room temperature for 7 days. Then, the precipitation occurred gradually.

[Formation of Zeolite Film by Direct Burning of Coated Film]

Example 5

Figure 2:
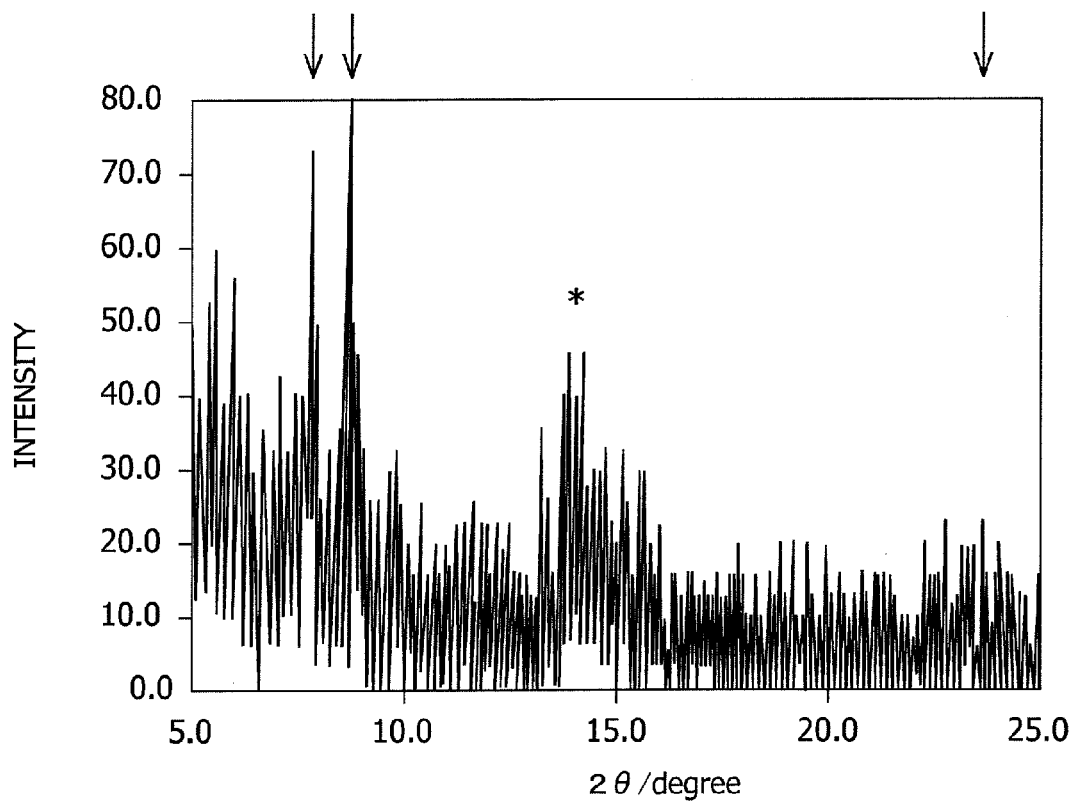
FIG. 2 shows X-ray diffraction results of the zeolite film obtained by burning in Example 5.
Figure 4:
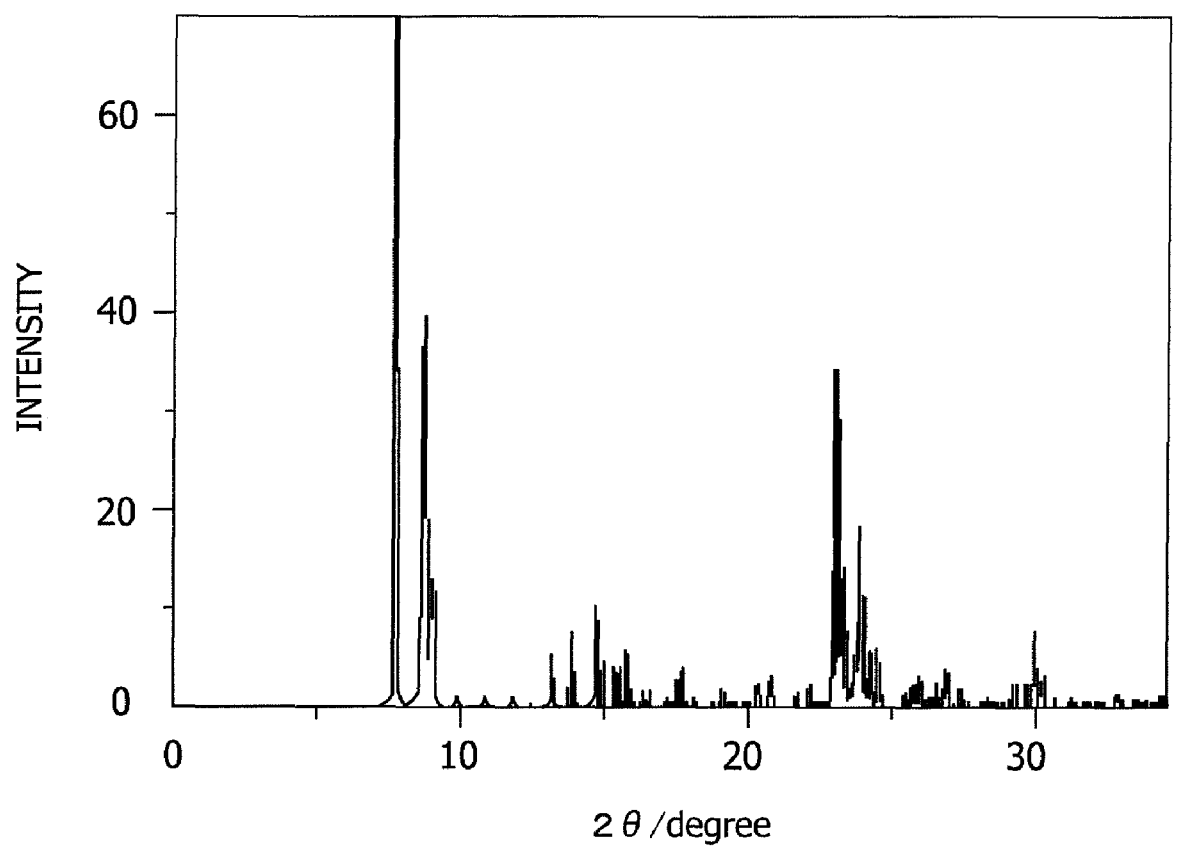
FIG. 4 is a X-ray crystal diffraction standard chart of a zeolite sample.

The coating solution obtained in Example 4 was spin-coated on a wafer, followed by preburning at 150° C. for 2 minutes. Then it was baked at 500° C. for 1 hour, whereby a zeolite film was obtained. X-ray crystal diffraction of the zeolite film was analyzed (FIG. 2) and was compared with the signal of zeolite sample (FIG. 4). As a result, it has been understood that the zeolite film had a signal at the same position (arrow) as that of the zeolite sample (FIG. 4) and a signal based on the regularity of a zeolite structure was confirmed. The signal with an affix * in FIG. 2 is a signal derived from a silicon wafer and has remained without elimination from the background.

[Preparation of Zeolite Film by Dry Gel Conversion and Burning]

Examples 6 to 9

The zeolite film-forming coating solutions obtained in Examples 1 to 4 were spin coated onto wafers, followed by preburning at 150° C. for 2 minutes. The wafers were each diced into a test piece of 5 cm square and placed in a 500 ml of an air tight container. With from 10 to 20 ml of water, they were subjected to dry gel conversion at 100° C. for 24 hours. The test pieces thus obtained were baked at 500° C. for 1 hour to obtain zeolite films, respectively.

Figure 3:
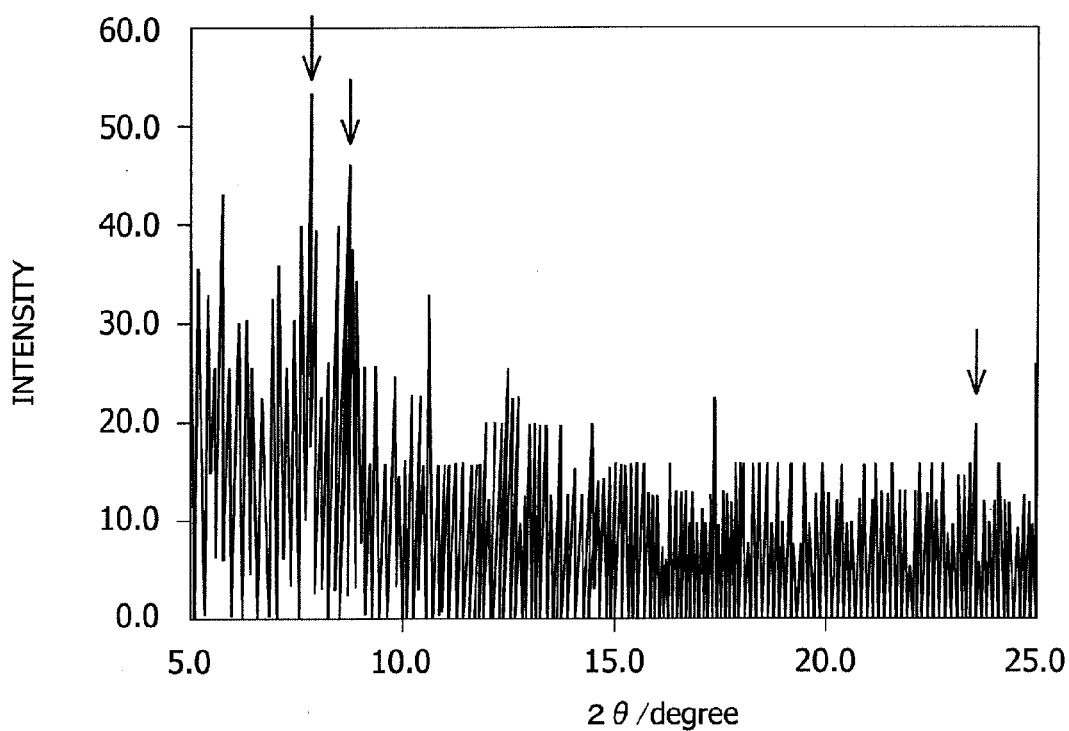
FIG. 3 shows X-ray diffraction results of the zeolite film obtained by burning after dry gel conversion in Example 6.

As a result of X-ray crystal diffraction (FIG. 3) of the film obtained in Example 6 (zeolite film obtained from the coating solution obtained in Example 1), it was understood that it had a signal at the same position (arrow) as that of a zeolite sample (FIG. 4) and a signal based on the regularity of zeolite was confirmed. Since no zeolite structure was formed in a film containing only silica but no zeolite seed crystals under such a condition, it was confirmed that the coating solution obtained in Example 1 contained fine particles having a zeolite crystal structure.

Comparative Example 5

The zeolite film-forming coating solution (obtained by subjecting the zeolite seed crystals prepared in Preparation Example 1 to solvent exchange as were) obtained in Comparative Example 3 was spin coated onto a wafer. A little striation was observed, but the wafer was prebaked at 150° C. for 2 minutes. The resulting wafer was placed in an airtight container. With a small amount of water, the wafer was subjected to dry gel conversion at 100° C. for 24 hours. Then, burning was performed at 500° C. for 1 hour, whereby a zeolite film was obtained.

[Measurement of Performance of Zeolite Film as a Low Dielectric Constant Dielectric Film]

With respect to the zeolite films obtained in Examples 6 to 9 and Comparative Example 5 by the dry gel conversion method and subsequent burning, appearance was observed by a scanning electron microscope and k value and Modulus were measured as a low dielectric constant property and film strength, respectively. In the appearance test, the film having a very smooth appearance, the film having a smooth appearance, the film having a surface roughness, and the film having a severe surface roughness were ranked A, B, C, and D, respectively.

For the measurement of k value and Modulus, "495CV system" (mercury probe) product of Solid State Measurement Inc. and "Nano Indenter SA2", product of MTS were used, respectively. The results are shown in Table 1.

TABLE 1

| Zeolite film | K | Modulus (GPa) | Appearance of film |
|---|---|---|---|
| Example 6 | 2.6 | 19 | A |
| Example 7 | 2.8 | 20 | A |
| Example 8 | 3.0 | 20 | B |
| Example 9 | —** | —** | D |
| Comp. Ex. 5 | —* | 20 | D |

*Unmeasurable,
**Peeling of film

The zeolite film obtained in Example 9 peeled during the dry gel conversion and subsequent burning. The k value of the zeolite film obtained in Comparative Example 5 was unmeasurable due to large in-plane fluctuations.

Figure 5:
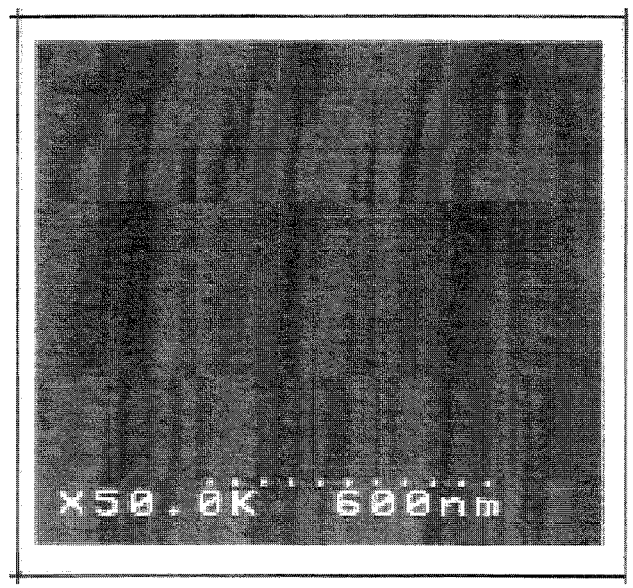
FIG. 5 is a scanning electron microscope image of the zeolite film obtained by burning after dry gel conversion in Example 6.
Figure 6:
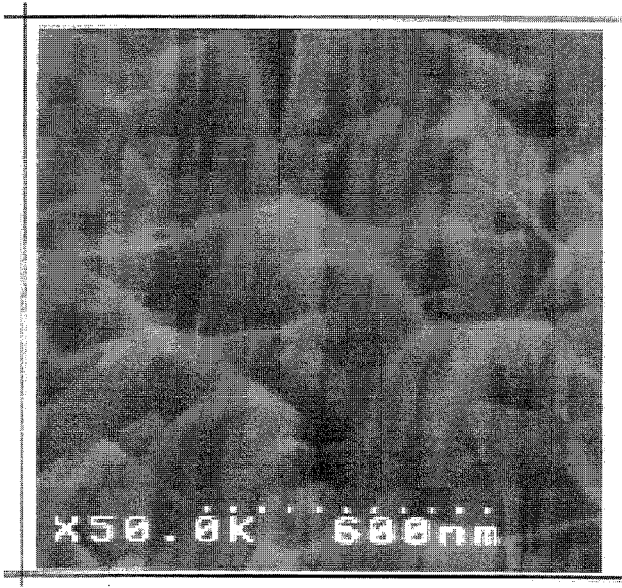
FIG. 6 is a scanning electron microscope image of the zeolite film obtained by burning after dry gel conversion in Comparative Example 5 (by the same magnification as that of FIG. 5).

As actual observation examples of appearance, the scanning electron microscope images of Example 6 (zeolite film obtained using the coating solution of Example 1) and Comparative Example 5 (zeolite film obtained using the coating solution of Comparative Example 3) are shown in FIGS. 5 and 6.

Film-forming composition solutions prepared using the organic-group-modified zeolite fine particles obtained in the invention, as shown in Examples 1 to 4, do not contain particles having an unusual particle size and are stable without using additional inactivation means. Such a solution was not formed by the conventional method. Moreover, since it does not contain particles having an unusual particle size, foreign matters mixed in the solution can be removed through filtration means depending on the particle size determined in advance.

A zeolite-containing film available from the composition containing organic-group-modified zeolite fine particles according to the invention can be used as a low-dielectric-constant dielectric film. By using the dry gel conversion method, the zeolite density of the film can be raised so that a low-dielectric-constant dielectric film with higher quality can be obtained.

Many modifications and other embodiments of the inventions set forth herein will come to mind to one skilled in the art to which these inventions pertain having the benefit of the teachings presented in the foregoing description. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A process for preparing a dispersion liquid of zeolite fine particles modified with an organic group, comprising:
    a first step of obtaining a liquid containing zeolite seed crystals having a particle size of 80 nm or less which are formed in the presence of a structure directing agent,
    a second step of adding, to the liquid obtained by the first step, a hydrolyzable silane compound which has an organic group containing at least one carbon atom bonded to a silicon atom of the silane compound, and
    a third step of maturing the liquid of the second step at a temperature higher than that of the first step.

2. The process according to claim 1, wherein the organic group is a substituted or unsubstituted hydrocarbon group.

3. The process according to claim 1, wherein the third step is performed at a pressure higher than that of the first step.

4. The process according to claim 1, wherein the zeolite seed crystals formed in the first step has a particle size distribution of which a maximum value is 10 nm or less.

5. The process according to claim 4, wherein the zeolite seed crystals formed in the first step has a particle size distribution of which the maximum value is 5 nm or less.

6. The process according to claim 1, further comprising a step of filtering the dispersion liquid obtained by the third step through a filter having a pore size of 0.2 μm or less.

7. The process according to claim 1, wherein in the dispersion liquid of zeolite fine particles modified with an organic group, a ratio of a molar amount of silicon atoms of the silane compound added in the second step to the total molar amount of silicon atoms in the dispersion liquid finally prepared other than the silicon atoms of the silicon compound of the second step is 0.01 to 1.

8. The process according to claim 1, wherein the zeolite seed crystals formed in the first step is obtained by hydrolyzing and condensing, in the presence of the structure directing agent, a compound represented by the following formula (1)

$$Si(OR^1)_4 \tag{1}$$

(wherein, $R^1(s)$ may be independently the same as or different from each $R^1$ and respectively represents a linear or branched $C_{1-4}$ alkyl group).

9. The process according to claim 1, wherein the structure directing agent is a quaternary ammonium salt represented by the following formula (2):

$$R^4_4 N^+ X^- \tag{2}$$

wherein, each of four $R^4$s may be independently the same as or different from each other and respectively represents a linear or branched $C_{1-6}$ alkyl group and X is OH, halogen, OAc or $NO_3$).

10. The process according to claim 1, wherein the organic-group-containing hydrolyzable silane compound is represented by the following formula (3):

$$R^2_n Si(OR^3)_{4-n} \tag{3}$$

(wherein, $R^2$ represents a linear, cyclic or branched $C_{1-6}$ alkyl group or aryl group, of which some hydrogen atoms may be substituted with a fluorine atom, $R^3$ represents a linear or branched $C_{1-4}$ alkyl group, when there are plural $R^2$s or $R^3$s, each of $R^2$s or $R^3$s may be independently the same as or different from each other, and n stands for an integer from 1 to 3).

11. The process according to claim 1, wherein, a compound represented by the following formula (4):

$$Si(OR^5)_4 \tag{4}$$

(wherein, each of four $R^5$s may be independently the same as or different from each other and respectively represents a linear or branched $C_{1-4}$ alkyl group) is added together with the organic-group-containing hydrolyzable silane compound in the second step.

* * * * *